United States Patent
Lee et al.

(10) Patent No.: US 7,981,782 B2
(45) Date of Patent: Jul. 19, 2011

(54) METHOD OF FABRICATING A SEMICONDUCTOR DEVICE INCLUDING ION IMPLANTATION AT A TILT ANGLE IN EXPOSED REGIONS

(75) Inventors: Min Yong Lee, Seoul (KR); Yong Soo Jung, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 179 days.

(21) Appl. No.: 11/757,323

(22) Filed: Jun. 1, 2007

(65) Prior Publication Data
US 2008/0160730 A1  Jul. 3, 2008

(30) Foreign Application Priority Data
Dec. 28, 2006  (KR) .................. 10-2006-0137138

(51) Int. Cl.
*H01L 21/425* (2006.01)
(52) U.S. Cl. ....................... 438/525; 438/527
(58) Field of Classification Search .................. 438/525, 438/527; 257/E21.334
See application file for complete search history.

(56) References Cited

U.S. PATENT DOCUMENTS

| | | | |
|---|---|---|---|
| 5,936,277 A | | 8/1999 | Takeuchi |
| 5,976,937 A | * | 11/1999 | Rodder et al. ................. 438/275 |
| 6,800,529 B2 | | 10/2004 | Kim |
| 2002/0055220 A1 | | 5/2002 | Soderbarg et al. |
| 2002/0109105 A1 | | 8/2002 | Lin et al. |
| 2003/0166324 A1 | | 9/2003 | Lin et al. |
| 2005/0087782 A1 | * | 4/2005 | Rhodes et al. ................. 257/292 |
| 2005/0170595 A1 | | 8/2005 | Li et al. |
| 2008/0020533 A1 | * | 1/2008 | Thei et al. ..................... 438/286 |

FOREIGN PATENT DOCUMENTS

| | | |
|---|---|---|
| JP | 2000-216108 | 8/2000 |
| JP | 2005-026644 | 1/2005 |
| KR | 1020050071028 A | 7/2005 |
| KR | 1020060014399 A | 11/2006 |
| KR | 1020060114399 A | 11/2006 |

* cited by examiner

*Primary Examiner* — William M. Brewster
(74) *Attorney, Agent, or Firm* — Kilpatrick Townsend & Stockton LLP

(57) ABSTRACT

A method of fabricating a semiconductor device includes forming a mask pattern for exposing a region of a semiconductor substrate. Dopant ions are implanted into the exposed region of the semiconductor substrate at a tilt angle of approximately 4.4° to 7°.

3 Claims, 6 Drawing Sheets

US 7,981,782 B2

METHOD OF FABRICATING A SEMICONDUCTOR DEVICE INCLUDING ION IMPLANTATION AT A TILT ANGLE IN EXPOSED REGIONS

CROSS-REFERENCES TO RELATED APPLICATIONS

The present application claims priority to Korean patent application number 10-2006-0137138, filed on Dec. 28, 2006, which is incorporated by reference in its entirety.

BACKGROUND OF THE INVENTION

The present invention relates to a method of fabricating a semiconductor device and, more particularly, to a method of ion implantation and a method of fabricating a semiconductor device which increases the production yield of the semiconductor device.

A semiconductor memory device such as a dynamic random access memory (DRAM) stores data in and reads data from a plurality of memory cells. The semiconductor memory device includes a plurality of bit lines and a plurality of word lines. The semiconductor memory device also includes a circuit for selecting a bit line and a word line. The semiconductor memory device further includes peripheral circuits, such as a sense amplifier, for sensing data read from a memory cell and for amplifying the data to a predetermined level.

The memory cell of the DRAM includes an access transistor and a capacitor. The data stored in the capacitor is transmitted to the bit line through the access transistor when the word line connected to the gate terminal of the access transistor is selected. The data is transmitted to a sense amplifier through the bit line. The sense amplifier senses and amplifies the data. The data is then transmitted to an input/output line. Data input through the input/output line is also amplified by the sense amplifier and written in the memory cell.

FIG. 1 is a circuit diagram showing an example of a conventional semiconductor memory device.

A semiconductor memory device 100 includes a pair of bit lines BL and /BL, a bit line equalizer 110, a sense amplifier 120, a column selection gate 130, a latch signal generator 140, and a sense amplifier activating circuit 150. The bit lines BL and /BL are connected to a memory cell MC to transmit data. The bit line equalizer 110 receives a precharge voltage $V_{BL}$ and equalizes the pair of bit lines BL and /BL to a same voltage level. The sense amplifier 120 senses and amplifies the data transmitted through the pair of bit lines BL and /BL. The column selection gate 130 is connected to a column selection line CSL to connect the pair of bit lines BL and /BL and input/output lines IO and /IO. The latch enable signal generator 140 receives the precharge voltage $V_{BL}$ and generates P-sense amplification and N-sense amplification latch enable signals LA and /LA to control the sense amplifier 120. The sense amplifier activating circuit 150 is connected to the latch enable signal generator 140.

The memory cell MC includes an access transistor connected to an intersection between the word line and the bit line, and a capacitor connected between the access transistor and a substrate voltage $V_P$.

The sense amplifier 120 includes a P-sense amplifier and an N-sense amplifier. The P-sense amplifier includes PMOS transistors 121 and 122 connected between the pair of bit lines BL and /BL in series. The PMOS transistors 121 and 122 have gate terminals respectively cross-connected to the pair of bit lines BL and /BL and source terminals for receiving the P-sense amplification latch enable signal LA. The N-sense amplifier includes NMOS transistors 123 and 124 connected between the pair of bit lines BL and /BL in series. The NMOS transistors 123 and 124 have gate terminals respectively cross-connected to the pair of bit lines BL and /BL and source terminals for receiving the N-sense amplification latch enable signal /LA.

The sense amplifier 120 includes four MOS transistors. Left and right transistors connected between the bit line BL and the bit line bar /BL are simultaneously driven. In other words, the threshold voltages of the left and right transistors are substantially identical. However, during operation of the transistors, the left and right transistors may not be simultaneously activated due to a variation in the threshold voltage between the left and right transistors. The sensing margin of the sense amplifier depends on offset characteristics, which depends on the difference between threshold voltages of the left and right transistors.

The left and right transistors are different from each other in a bump failure rate of a semiconductor memory device.

FIG. 2 is a graph showing a bump failure rate vs. the position of a transistor included in a sense amplifier of a semiconductor memory device. A horizontal axis indicates the transistor and a vertical axis indicates the number of bump failures. Reference numerals "U0" and "U1" respectively indicate the left and right transistors located at an upper side, and reference numerals "L0" and "L1" respectively indicate the left and right transistors located at a lower side.

The bump failure rates of the right transistors are larger than those of the left transistors. In addition, the threshold voltages of the right transistors are larger than those of the left transistors. Thus, the characteristics of the device significantly deteriorate.

The difference between the threshold voltages of the transistors included in the sense amplifier deteriorates the offset characteristics of the sense amplifier, thereby adversely affecting the production yield of the device.

BRIEF SUMMARY OF THE INVENTION

In an aspect of the present invention, a method of implanting ions comprises forming a mask pattern for exposing a region of a semiconductor substrate and implanting dopant ions into the exposed region of the semiconductor substrate at a tilt angle of approximately 4.4° to 7°.

In another aspect of the present invention, a method of fabricating a semiconductor device comprises forming a mask pattern for defining a region on a semiconductor substrate. A well will be formed in the defined region. Dopant ions are implanted into the defined region of the semiconductor substrate at a tilt angle of approximately 4.4° to 7°.

In another aspect of the present invention, a method of fabricating a semiconductor device comprises forming a mask pattern for defining a region on a semiconductor substrate. A field stop impurity layer will be formed in the defined region. Dopant ions are implanted into the defined region of the semiconductor substrate at a tilt angle of approximately 4.4° to 7°.

In another aspect of the present invention, a method of fabricating a semiconductor device comprises forming a mask pattern for defining a region on a semiconductor substrate. An impurity layer for suppressing punch-through will be formed in the defined region. Dopant ions are implanted into the defined region of the semiconductor substrate at a tilt angle of approximately 4.4° to 7°.

In another aspect of the present invention, a method of fabricating a semiconductor device comprises forming a mask pattern for defining a region on a semiconductor substrate. An impurity layer for adjusting the threshold voltage of a cell will be formed in the defined region. Dopant ions are implanted into the defined region of the semiconductor substrate at a tilt angle of approximately 4.4° to 7°.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE INVENTION

The present invention examines the cause of mismatched transistors included in a sense amplifier and provides a method of solving problems associated with the mismatch. In order to examine the cause of the mismatch, the mask layout of the sense amplifier will be described.

Figure 3:
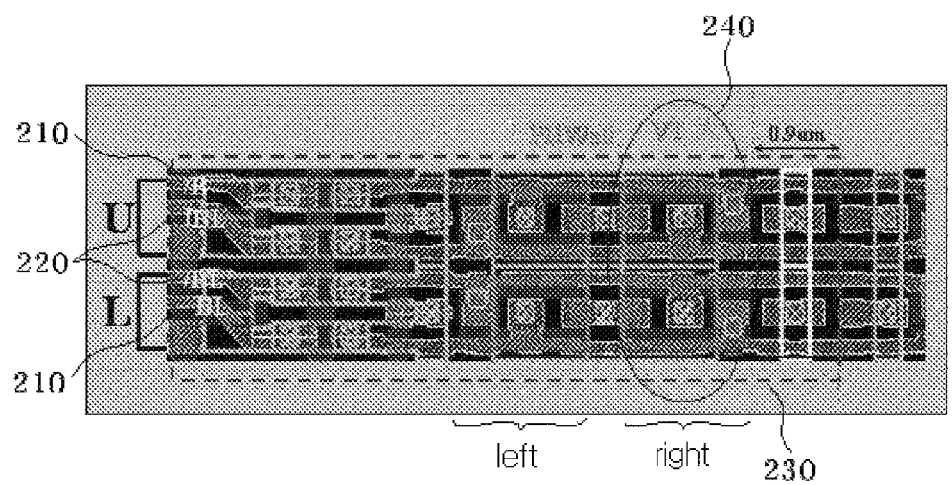
FIG. 3 is a view showing a mask layout of a sense amplifier.

FIG. 3 is a view showing a mask layout of a sense amplifier.

Four transistors are symmetrically provided between a pair of bit lines BL (210) and /BL (220). In particular, two left transistors are spaced from the edge of a P-well 230 by at least a predetermined distance, and two right transistors are spaced from the edge of the P-well 230 by about 0.9 μm.

Figure 1:
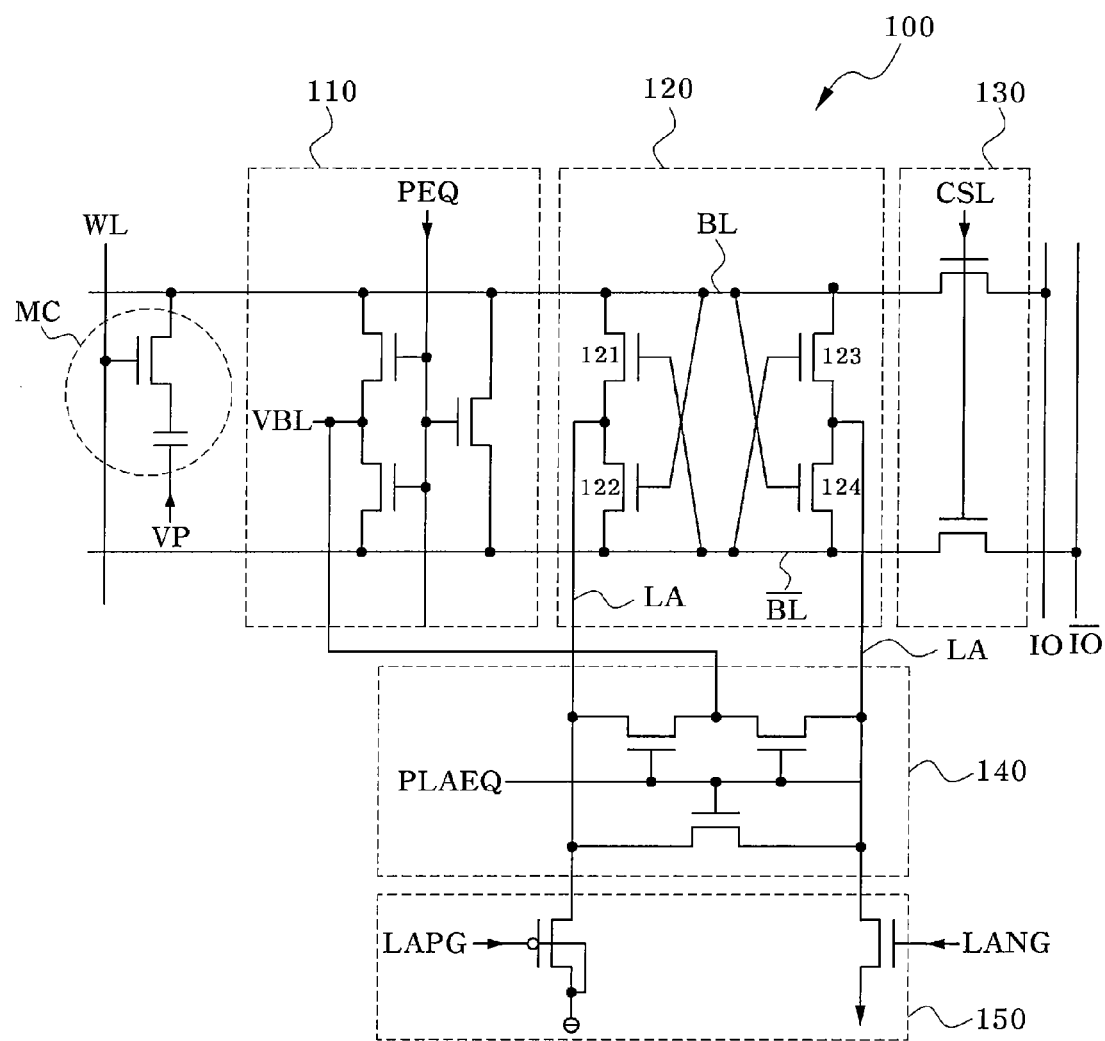
FIG. 1 is a circuit diagram showing an example of a conventional semiconductor memory device.
Figure 2:
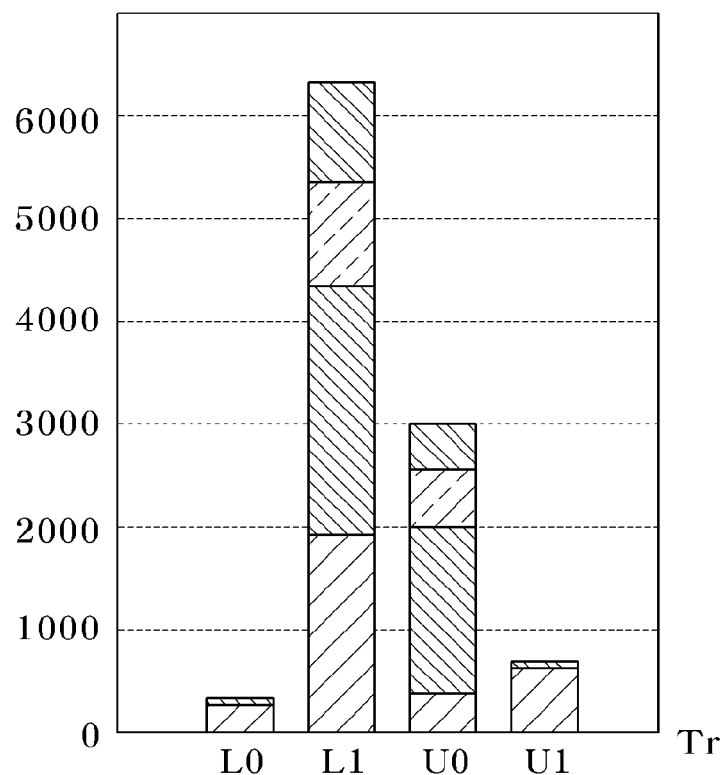
FIG. 2 is a graph showing a bump failure rate vs. the position of a transistor included in a sense amplifier of a semiconductor memory device.

As shown in FIG. 2, the bump failure rate of the two right transistors 240 is larger than that of the two left transistors. Accordingly, the bump failure rate is associated with the distance between the transistor and the P-well.

In order to fabricate a semiconductor memory device, a variety of processes including a laminating process, an etching process, an ion implanting process, and the like, must be performed. The ion implanting process accelerates dopant ions, such as boron (B) or arsenic (As) ions, using a strong electric field and passes the dopant ions through the surface of a wafer. The ion implantation may change the electric characteristics of a material. When the ion implanting process is performed, the ions are implanted at a predetermined tilt angle such that channeling does not occur due to the silicon lattice of a semiconductor substrate. The dopant ions are implanted at a tilt angle of about approximately 7° to 9°.

Figure 4:
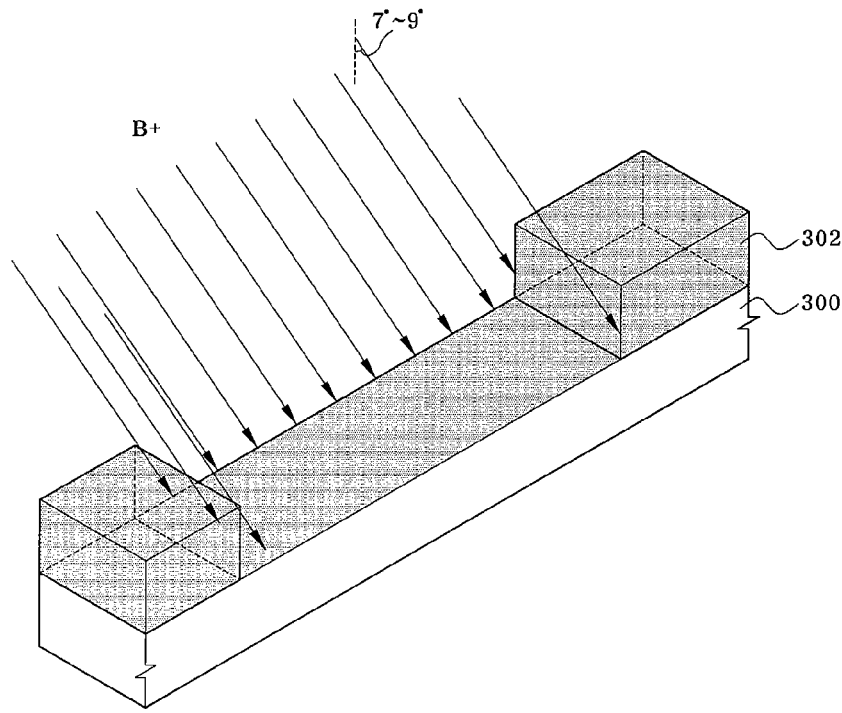
FIGS. 4 and 5 are views showing dopant ions scattered at the sidewall of a photoresist pattern taken along line A-A' of FIG. 3.
Figure 5:
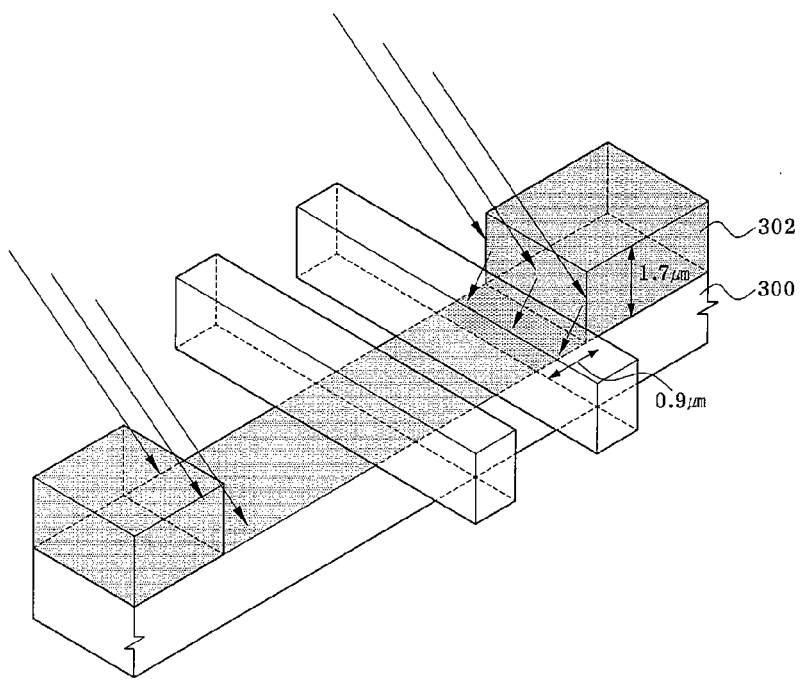

FIG. 4 is a view showing the process of implanting ions at a predetermined tilt angle such that channeling does not occur when dopant ions are implanted into a semiconductor substrate. FIG. 5 is a view showing dopant ions scattered at the sidewall of a photoresist pattern when ions are implanted at a tilt angle of about 7° to 9°.

A first conductive type, for example N-type, of semiconductor substrate 300 is provided. A photoresist pattern 302 is formed on the semiconductor substrate 300 such that a region of the semiconductor substrate 300 in which a P-well will be formed is exposed. The photoresist pattern 302 has a thickness for sufficiently masking dopant ions which are implanted at an energy of several tens to several hundreds of KeV. The photoresist pattern 302 has, for example, a thickness of about 1.7 μm. P-type dopant ions, for example boron (B), are implanted into the exposed region of the semiconductor substrate at a tilt angle of about 7° to 9°.

The boron (B) ions are accelerated and implanted at an energy of several tens to several hundreds of KeV. The dopant ions are normally implanted into the left portion of the region in which the P-well will be formed. The dopant ions implanted into the right portion of the region in which the P-well will be formed collide with the sidewall of the photoresist pattern 302 and are then implanted into the semiconductor substrate 300. In other words, a scattering phenomenon occurs because the ions are implanted into the semiconductor substrate 300 at a tilt angle of 7° to 9° to prevent the channeling, rather than vertically implanting the ions into the semiconductor substrate 300. Accordingly, the concentration of the dopant ions in the right portion of the P-well becomes larger than an initial concentration. The threshold voltage Vt of a transistor increases as the dopant concentration increases. Accordingly, the threshold voltage of the transistor formed in the right portion of the P-well increases. As a result, the mismatch occurs between the threshold voltages of the transistor formed in the left portion of the P-well and the transistor formed in the right portion of the P-well. Thus, the characteristics of the device deteriorate causing a bump failure.

In order to prevent the scattering phenomenon, the ion-implantation tilt angle is reduced. However, when the tilt angle is excessively reduced, the profile of the dopant concentration varies and the characteristics of the transistor deteriorate. In other words, when the dopant ions are implanted into a substrate having a regular crystal structure, such as a silicon (Si) substrate, at a tilt angle of 0°, a channeling phenomenon occurs when the implanted dopant ions pass through the crystal structure. In a subsequent step, the dopant ions may escape from the semiconductor substrate. When the dopant concentration increases to prevent such a phenomenon, another problem occurs. Accordingly, an optimal ion-implantation tilt angle prevents the dopant ions from scattering without causing channeling.

In order to obtain the optimal ion-implantation tilt angle which prevents the dopant ions from scattering without causing the channeling, the ions are implanted while changing the ion-implantation tilt angle from approximately 2° to 6° by one degree increments. $B^{11}$ ions having a small atomic mass unit (AMU) are used as the dopant ions. The dopant ions have a concentration of approximately $2 \times 10^{13}$ atoms/cm$^2$ and an applied energy of approximately 90 KeV. The twist angle of the semiconductor substrate is approximately 112°. The twist angle indicates the rotation angle of the semiconductor substrate when the ions are implanted.

Figure 6:
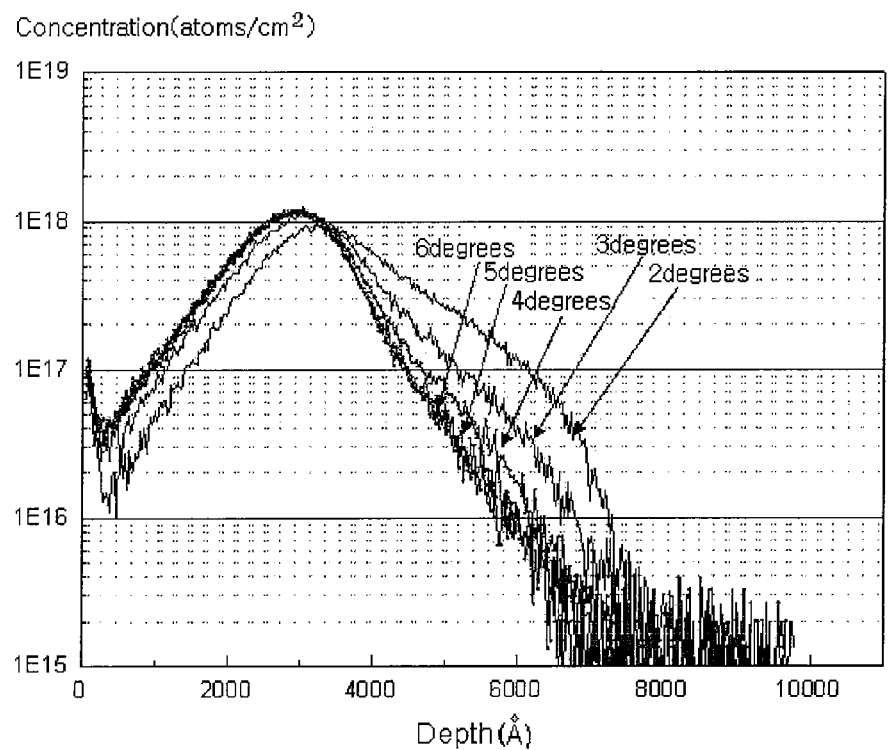
FIG. 6 is a graph showing a profile of dopant concentration vs. an ion implantation angle.

FIG. 6 is a graph showing the profile of dopant concentration vs. the ion implantation angle. When the ion implantation angle is 4° or more, transistor characteristics are excellent in spite of the mismatched threshold voltages.

As the atomic mass unit of the dopant decreases, channeling occurs more easily. The channeling does not occur with $B^{11}$ having a small AMU when the ion implantation angle is 4° or more. Accordingly, when a minimum ion implantation angle is about 4.4° channeling does not occur and the scattering of the dopant at the edge of the well is reduced. Thus, it is possible to prevent transistor characteristics from deteriorating and to improve transistor characteristics in the sense amplifier.

Figure 7:
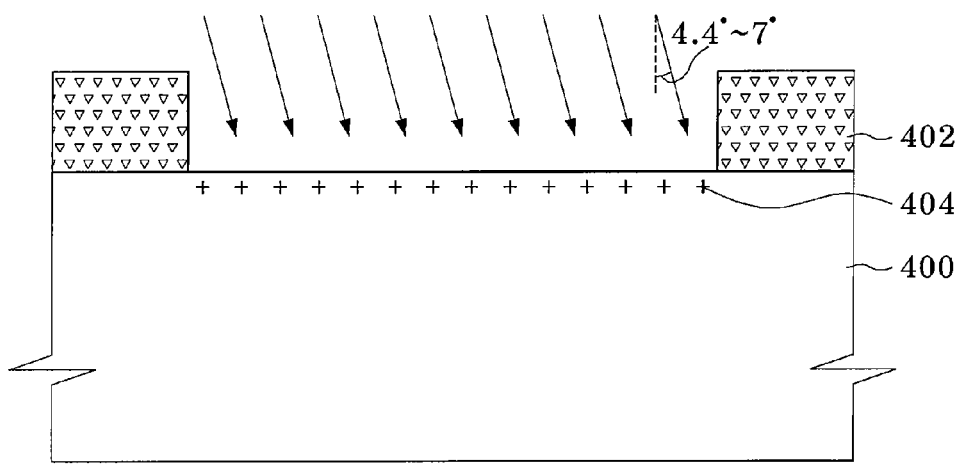
FIGS. 7 and 8 are cross-sectional views illustrating a method of fabricating a semiconductor memory device according to the present invention.
Figure 8:
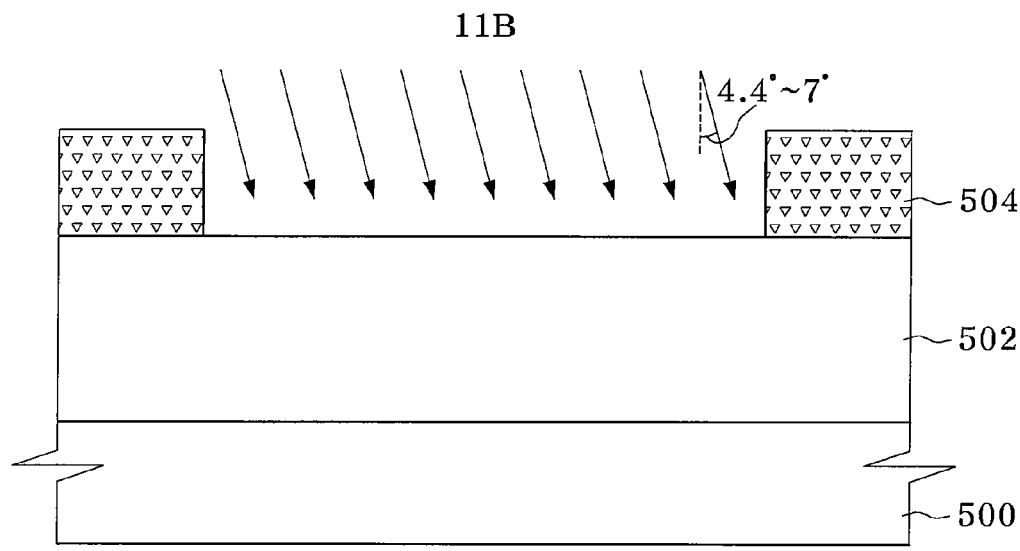

FIGS. 7 and 8 are cross-sectional views illustrating a method of fabricating a semiconductor memory device according to the present invention.

FIG. 7 is a cross-sectional view showing an ion implanting process for forming a P-well or an N-well in a semiconductor substrate.

A first conductive type, for example a P-type, of semiconductor substrate 400 is provided. A photoresist pattern 402 for defining a region in which a P-well will be formed is formed on the semiconductor substrate. The photoresist pattern 402 has a thickness which allows the photoresist pattern to function as a mask when implanting ions. The photoresist pattern 402 has, for example, a thickness of about 1.7 µm. P-type dopant ions, for example $B^{11}$ ions, are implanted into the semiconductor substrate 400 defined by the photoresist pattern 402 to form an impurity layer 404 for forming the P-well.

The ion implantation angle is in a range of approximately 4.4° to 7° to suppress the scattering of the dopant ions at the sidewall of the photoresist pattern 402 and to prevent channeling. The concentration of the implanted dopant ions is in a range of about $1\times10^{13}$ atoms/cm$^2$ to $2\times10^{13}$ atoms/cm$^2$. The applied energy is in a range of approximately 250 to 350 KeV. An annealing process is performed at a predetermined temperature such that the implanted dopant ions are diffused to form the P-well (not shown).

When the dopant ions are implanted at the angle of approximately 4.4° to 7° to form the P-well or the N-well, scattering of the dopant ions at the sidewall of the photoresist pattern 402 is suppressed while channeling is prevented. When the P-well or the N-well is formed in the semiconductor memory device by the above-described method, uniform characteristics can be obtained.

An N-well is formed in a region in which a PMOS transistor will be formed by the above-described method. The ion implantation angle is in a range of approximately 4.4° to 7° to suppress the scattering of the dopant ions at the sidewall of the photoresist pattern and to prevent channeling. $P^{31}$ ions may be used as the dopant ions. The concentration of the implanted dopant ions is in a range of about $1\times10^{13}$ atoms/cm$^2$ to $2\times10^{13}$ atoms/cm$^2$, and applied energy is in a range of about 1,000 to 1,200 KeV.

FIG. 8 is a cross-sectional view showing a channel stop ion implanting process for preventing a field from being formed in a well region.

A well 502 is formed in a semiconductor substrate 500 by a dopant ion implanting process and an annealing process. A photoresist pattern 504 for defining a region into which channel stop dopant ions are implanted is formed on the semiconductor substrate 500 in which the well 502 is formed. The photoresist pattern 504 has a thickness for allowing the photoresist pattern to function as a mask when implanting the ions. In one embodiment, the thickness of the photoresist pattern 504 is about 1.7 µm. The channel stop dopant ions are implanted into the exposed region of the semiconductor substrate 500. In a region in which an NMOS transistor will be formed, $B^{11}$ ions are used as the dopant ions. The concentration of the implanted dopant ions is in a range of about $0.5\times10^{13}$ atoms/cm$^2$ to $1\times10^{13}$ atoms/cm$^2$, and applied energy is in a range of approximately 70 to 120 KeV. The ion implantation angle is in a range of approximately 4.4° to 7° to suppress the scattering of the dopant ions at the sidewall of the photoresist pattern and to prevent channeling.

In a region in which a PMOS transistor will be formed, $P^{31}$ ions are used as the dopant ions. The concentration of the implanted dopant ions is in a range of about $0.8\times10^{12}$ atoms/cm$^2$ to $1.2\times10^{12}$ atoms/cm$^2$, and applied energy is 200 to 300 KeV. Similarly, the ion implantation angle is in a range of approximately 4.4° to 7°.

A dopant ion implanting process for preventing punch-through is performed, similar to the dopant ion implanting process for preventing the field.

A photoresist pattern is formed on a semiconductor substrate and dopant ions are implanted into a semiconductor substrate using the photoresist pattern as an ion implantation mask. In a region in which a PMOS transistor will be formed, $B^{11}$ ions are used as the dopant ions. The dose of the implanted dopant ions is in a range of about $0.5\times10^{13}$ atoms/cm$^2$ to $1\times10^{13}$ atoms/cm$^2$, and applied energy is in a range of approximately 30 to 80 KeV. The ion implantation angle is in a range of approximately 4.4° to 7° to suppress the scattering of the dopant ions at the sidewall of the photoresist pattern and to prevent channeling.

The above-described method is performed in a region in which an NMOS transistor will be formed. $As^{75}$ ions are implanted at a concentration of about $9.4\times10^{12}$ atoms/cm$^2$ and applied energy of approximately 150 KeV. The ion implantation angle is in a range of approximately 4.4° to 7°.

A channel ion implanting process for adjusting the threshold voltage of a cell will be described.

A photoresist pattern for exposing a region in which a channel region of a PMOS transistor will be formed, is formed on a semiconductor substrate. The dopant ions are implanted into the exposed region of the semiconductor substrate using the photoresist pattern as an ion implantation mask. $BF2^{49}$ ions are used as the dopant ions. Applied energy is in a range of approximately 10 to 40 KeV. The concentration of the implanted dopant ions is in a range of about $1.0\times10^{13}$ atoms/cm$^2$ to $3\times10^{13}$ atoms/cm$^2$. The ion implantation angle is in a range of approximately 4.4° to 7°.

The ion implanting process for adjusting the threshold voltage of the cell is similarly performed in a region in which an NMOS transistor will be formed. $P^{31}$ ions are implanted with an applied energy of 10 to 40 KeV, a concentration of about $1.0\times10^{12}$ atoms/cm$^2$ to $35\times10^2$ atoms/cm$^2$, and an ion implantation angle of approximately 4.4° to 7°.

As would be understood by one having ordinary skill in the art, the sequence of each of the ion implanting processes may be changed.

Figure 9:
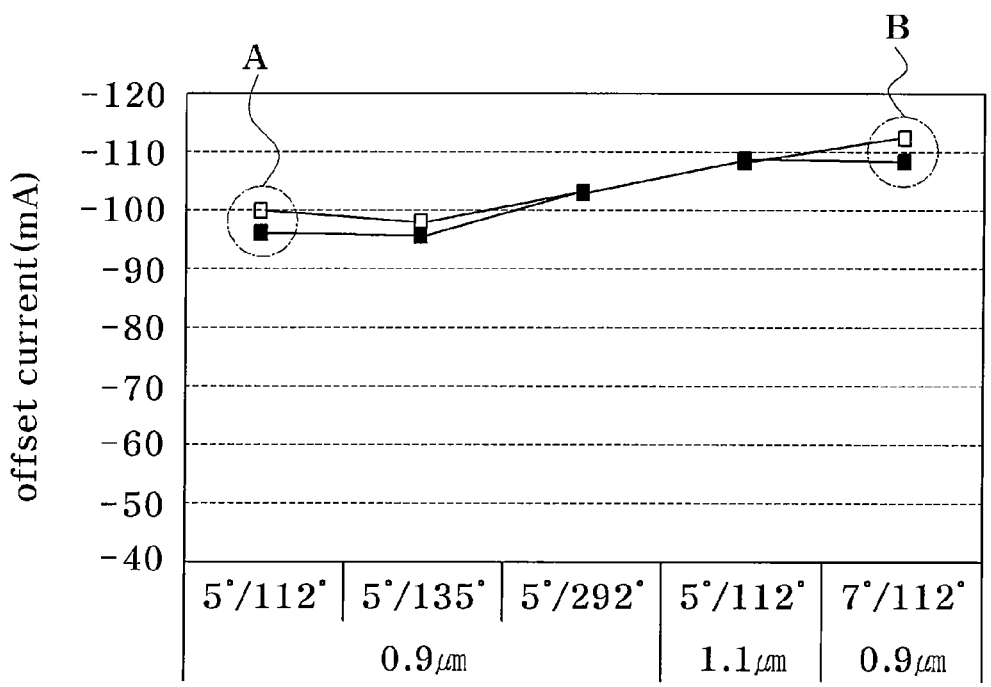
FIG. 9 is a graph showing an amount of offset current vs. an ion implantation angle.

FIG. 9 is a graph showing the amount of offset current vs. an ion implantation angle.

In particular, FIG. 9 shows that the amount of offset current varies depending on the twist angle of a semiconductor substrate and an ion implantation angle when a distance between a gate and the edge of a well is 0.9 µm and 1.1 µm.

When the distance between the gate and the edge of the well is 0.9 µm, the twist angle of the semiconductor substrate is 112°, and the ion implantation angle is 7°, the offset current is −110 mA (reference numeral B). In contrast, when the distance between the gate and the edge of the well is 0.9 µm, the twist angle of the semiconductor substrate is 112°, and the ion implantation angle is 5°, the offset current is −100 mA (reference numeral A). The offset current is reduced by about 10 mA. In other words, the sensing margin increases by about 10% by decreasing the ion implantation angle by 2°.

Figure 10:
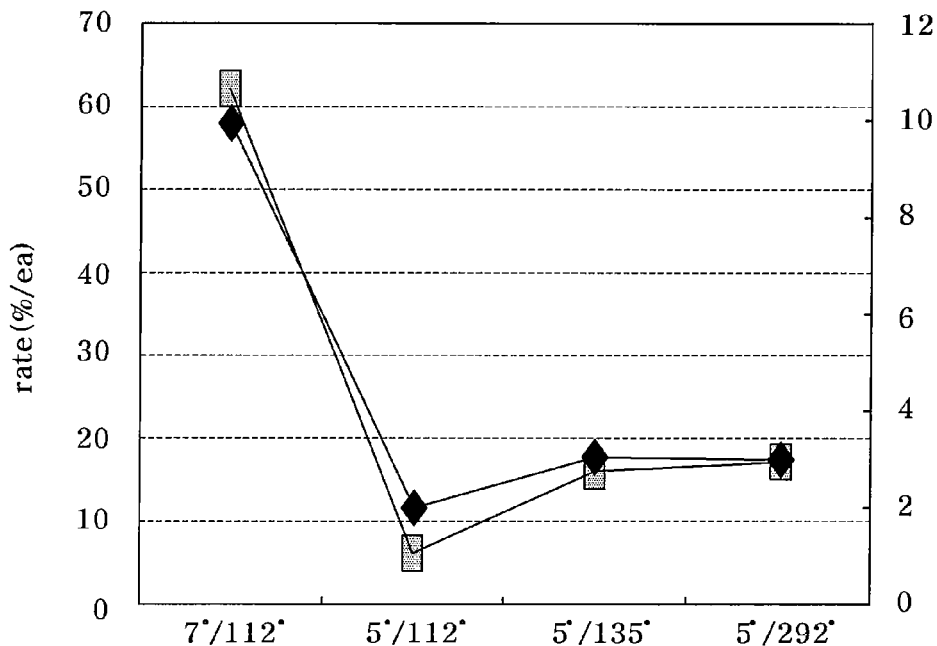
FIG. 10 is a graph showing a two-column failure rate vs. an ion implantation angle.

FIG. 10 is a graph showing a two-column failure rate vs. an ion implantation angle. FIG. 10 shows the failure rate when the ion implantation angle is 7° and 5°.

When the ion implantation angle is 7° and the twist angle of the semiconductor substrate is 112°, the failure rate is about 60%. In contrast, when the ion implantation angle is 5° and the twist angle of the semiconductor substrate is 112°, the failure rate is about 10%. In other words, the failure rate is reduced by about 50% by decreasing the ion implantation angle by 2°.

Figure 11:
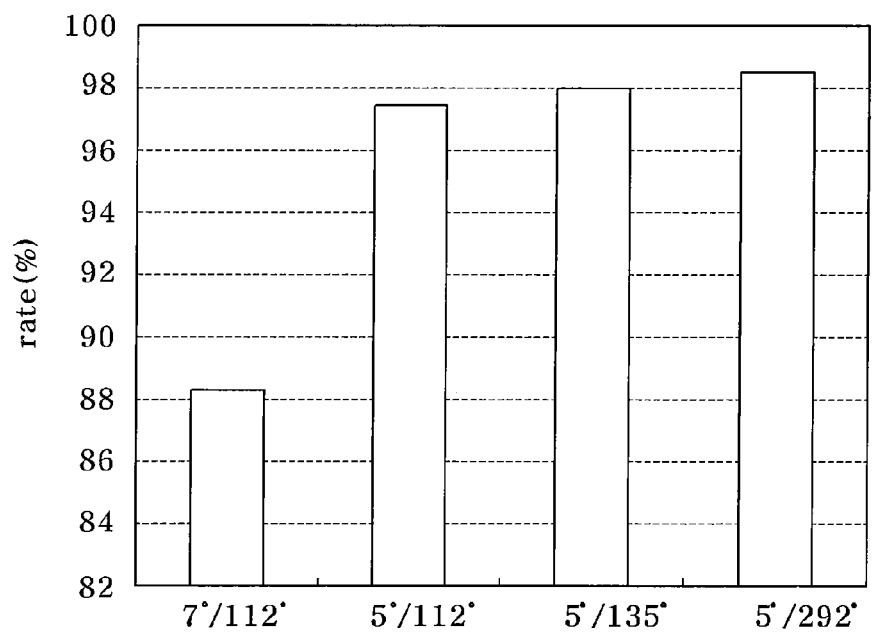
FIG. 11 is a graph showing a production yield vs. an ion implantation angle.

FIG. 11 is a graph showing a production yield vs. an ion implantation angle. FIG. 11 shows the yields when the ion implantation angle is 7° and 5°.

When the ion implantation angle is 7° and the twist angle of the semiconductor substrate is 112°, the yield is 88%. In contrast, when the ion implantation angle is 5° and the twist angle of the semiconductor substrate is 112°, the yield increases to about 98%. In other words, the production yield increases as the failure rate decreases.

The reduction of the offset voltage of a sense amplifier means that amplification is possible and sensing capability is improved with a small variation in voltage. When the sense amplifier cannot sense a small offset voltage (i.e., cannot perform the amplification) the bit lines BL and /BL cannot transmit a signal. As a result, a failure occurs and the device must be discarded. Thus, production yield decreases.

According to the present invention, a mismatch between latch transistors can be overcome and offset characteristics can be improved without shifting the threshold voltages of the transistors while preventing channeling when implanting ions. When the threshold voltage of a transistor increases, a sensing speed decreases from 1 GHz to 333 MHz thereby reducing the value of a memory device. When the threshold voltage of the transistor decreases, a punch-through is formed at a junction between the transistors thereby significantly decreasing the production yield. According to the present invention, it is possible to improve the offset characteristics by 10% or more. Accordingly, the 2-column failure rate can be improved from 60 bits to 10 bits. Thus, it is possible to increase the production yield of the device by 20% or more. The present invention is applicable to a flash memory device as well as a DRAM.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method of fabricating a semiconductor device having a well of a first conductive type arranged in a semiconductor substrate, first kind of transistors and second kind of transistors arranged in the well and spaced apart from a boundary of the well to a different space, wherein the first and second kind of transistors are connected to a pair of bit lines and operate symmetrically, the method comprising:
   forming a photoresist pattern that exposes a region of a semiconductor substrate, wherein the photoresist pattern has a thickness from 0.5 µm to 5.0 µm; and
   implanting dopant ions into a portion of the exposed region of the semiconductor substrate that directly borders the photoresist pattern at a tilt angle selected to account for the presence of the photoresist pattern, the tilt angle selected from a range of approximately 4.4° to 6.9° such that a portion of the dopant ions collides with a side wall of the photoresist pattern that directly borders the portion of the expose region and the portion of the exposed region is implanted with the dopant ions without causing channeling in the semiconductor substrate.

2. The method according to claim 1, wherein the photoresist pattern has a thickness of approximately 1.7 µm.

3. The method according to claim 1, wherein the tilt angle is selected from a range of 4.4 to 4.9 degrees.

* * * * *